(12) United States Patent
Imakita et al.

(10) Patent No.: US 8,304,357 B2
(45) Date of Patent: Nov. 6, 2012

(54) CERAMIC MATERIAL COMPOSITION

(75) Inventors: Kenji Imakita, Chiyoda-ku (JP);
Toshihisa Okada, Chiyoda-ku (JP);
Kazuo Watanabe, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 246 days.

(21) Appl. No.: 12/894,499

(22) Filed: Sep. 30, 2010

(65) Prior Publication Data
US 2011/0079412 A1 Apr. 7, 2011

(30) Foreign Application Priority Data
Oct. 7, 2009 (JP) .................................. 2009-233562

(51) Int. Cl.
*C03C 8/14* (2006.01)
*C03C 8/20* (2006.01)

(52) U.S. Cl. ............... 501/17; 501/18; 501/21; 501/23; 501/66; 501/77; 428/210; 257/79; 257/100

(58) Field of Classification Search .............. 501/17, 501/18, 21, 32, 66, 77; 428/210; 257/79, 257/100
See application file for complete search history.

(56) References Cited

U.S. PATENT DOCUMENTS

| | | | | |
|---|---|---|---|---|
| 5,242,867 A * | 9/1993 | Lin et al. | ........................ | 501/32 |
| 5,260,119 A * | 11/1993 | Jean et al. | ..................... | 428/210 |
| 6,136,734 A * | 10/2000 | Jean et al. | ........................ | 501/32 |
| 6,362,119 B1 * | 3/2002 | Chiba | ............................. | 501/15 |
| 6,835,682 B2 * | 12/2004 | Cho et al. | ........................ | 501/32 |
| 6,841,493 B2 * | 1/2005 | Cho et al. | ........................ | 501/32 |
| 7,160,823 B2 * | 1/2007 | Park et al. | ........................ | 501/32 |
| 7,944,143 B2 * | 5/2011 | Choi et al. | .................... | 313/512 |
| 7,999,372 B2 * | 8/2011 | Park | ............................. | 257/707 |
| 8,026,511 B2 * | 9/2011 | Choi et al. | ...................... | 257/40 |
| 8,063,261 B2 * | 11/2011 | Rokicki et al. | ................ | 585/663 |
| 8,110,982 B2 * | 2/2012 | Kwon et al. | ................... | 313/504 |

FOREIGN PATENT DOCUMENTS

| | | |
|---|---|---|
| JP | 11-43369 | 2/1999 |
| JP | 2006-206378 | 8/2006 |
| JP | 2007-129191 | 5/2007 |
| RU | 2101164 C1 * | 1/1998 |
| WO | WO 2009/057878 A1 | 5/2009 |
| WO | WO 2009/119433 A1 | 10/2009 |

OTHER PUBLICATIONS

Extended Search Report issued Dec. 22, 2011 in European Patent Application No. 10013322.2-1218.

* cited by examiner

*Primary Examiner* — Anthony J Green
(74) *Attorney, Agent, or Firm* — Oblon, Spivak, McClelland, Maier & Neustadt, L.L.P.

(57) ABSTRACT

A ceramic material composition comprising from 20 to 50 mass % of a borosilicate glass powder, from 25 to 55 mass % of an alumina filler powder and from 10 to 45 mass % of a filler powder (a high refractive index filler powder) having a refractive index higher than the alumina filler powder, wherein the borosilicate glass powder comprises, as calculated as oxides, from 30 to 70 mass % of $SiO_2$, from 5 to 28 mass % of $B_2O_3$, from 5 to 30 mass % of $Al_2O_3$, from 3 to 35 mass % of CaO, from 0 to 25 mass % of SrO, from 0 to 25 mass % of BaO, from 0 to 10 mass % of $Na_2O$, from 0 to 10 mass % of $K_2O$, from 0.5 to 10 mass % of $Na_2O+K_2O$ and from 3 to 40 mass % of CaO+SrO+BaO, and satisfies the following conditions:

in the borosilicate glass powder, as represented by mass %, the value of "three times the $B_2O_3$ content"+"twice (the CaO content+the SrO content+the BaO content)"+"ten times (the $Na_2O$ content+the $K_2O$ content)", is within a range of from 105 to 165.

8 Claims, No Drawings

CERAMIC MATERIAL COMPOSITION

BACKGROUND OF THE INVENTION

1. Field of the Invention

The present invention relates to a ceramic material composition and a ceramic substrate (hereinafter sometimes referred to simply as "a substrate") constituted by using the ceramic material composition. Particularly, it relates to a ceramic material composition for a ceramic substrate having a high flexural strength and a high reflectance, and a package to be mounted on a light emitting diode element using the ceramic substrate.

2. Discussion of Background

In recent years, along with a tendency to high brightness and high efficiency of a light emitting diode (hereinafter sometimes referred to as LED) element, a light emitting device employing an LED element has been used for a backlight of a mobile phone, a large sized liquid crystal TV, etc., or for general illumination. Along with this, in recent years, members peripheral to the LED element are also required to have higher performance. For example, as a material for a package on which an LED element is mounted, heretofore, a resin-based material has been used. However, along with a tendency to high brightness of an LED element, a problem arose such that the resin is deteriorated by heat and light from the LED element, and in recent years, an inorganic material represented by a ceramic is used.

As a package comprising a ceramic, an alumina substrate and an aluminum nitride substrate which have been used for a wiring board, may be mentioned. They are highly durable against heat and light as compared with a resin package, and in this view, they are promising as an LED element package. However, on the other hand, these materials have a low reflectance as compared with a conventional resin package. As the reflectance is low, light from the LED element will leak to the back side of the substrate, and the light intensity in the front tends to be decreased. Further, since such a substrate is hardly sintered, high temperature firing at higher than 1,500° C. is required, thus leading to an increase in the process cost.

In order to solve such problems, a low temperature co-fired ceramic (hereinafter sometimes referred to as LTCC) substrate started being used as an LED element package. An LTCC is usually a composite comprising glass and a ceramic filler of e.g. alumina, and can be sintered at a low temperature as compared with a conventional ceramic substrate since it is sintered employing low temperature flowability of glass. Commonly, it is capable of being fired at a temperature at a level of from 850° C. to 900° C., and can be co-fired with an Ag conductor, and thus its cost is lower than a conventional ceramic. Further, it is characterized by having a high reflectance as compared with an alumina substrate and an aluminum nitride substrate, since light is diffusely reflected on an interface between glass and ceramic particles. Further, since the LTCC comprises an inorganic substance, it has high durability against heat and light.

However, commonly, an LTCC substrate has a low flexural strength as compared with an alumina substrate and an aluminum nitride substrate. When the LTCC substrate is processed into an LED element package, it is cut by folding a notched portion or cut by so-called dicing by diamond abrasive grains. On that occasion, if the substrate itself is also broken or chipping (cracking) occurs, the package will be broken, thus leading to a decrease in the yield and thus an increase in the cost. Accordingly, a high flexural strength of a substrate, typically at least 250 MPa, is required. The flexural strength is usually 400 MPa in the case of an alumina substrate or 300 MPa in the case of an aluminum nitride substrate. Further, a conventional LTCC has a reflectance higher than the reflectances of an alumina substrate and an aluminum nitride substrate but lower than the reflectance of a resin substrate. In recent years, along with an improvement in performance of LED, further higher reflectance than that of a conventional LTCC has also been required.

Further, a ceramic substrate for an LED element package is required to have high acid resistance in some cases. For example, a ceramic substrate for an LED element package is provided with an external wiring conductor on its outer surface in many cases, and for the purpose of protecting the wiring conductor, plating is applied in some cases. In the plating step, the ceramic substrate is usually immersed in a strongly acidic plating liquid, and accordingly in a case where the plating step is required, the ceramic substrate for an LED element package is required to have high acid resistance.

The LTCC disclosed in Patent Document 1 is a conventional LTCC for a wiring board, comprising Si—B—Al—Ca type glass and an alumina filler. It has a relatively high flexural strength of higher than 300 MPa. However, such an LTCC has a low reflectance as compared with a resin package, and a further higher reflectance is required for an application to an LED package.

On the other hand, in Patent Document 2, an improvement in the reflectance is attempted by adding a ceramic filler having a high refractive index to a Si—B—Al—Ca type LTCC. A ceramic filler having a high refractive index provides a great difference in the refractive index with glass, whereby the diffuse reflection on the glass-ceramic interface will be significant and as a result, the reflectance of the substrate will be improved. However, in general, if a high refractive index ceramic filler of e.g. titania or zirconia is incorporated in the LTCC, the sintering properties of the LTCC will be decreased, thus leading to insufficient sintering, whereby flexural strength will be decreased. In the LTCC as disclosed in Patent Document 2, a titania filler is used as the high refractive index ceramic filler, however, its amount is limited to 10 mass % or smaller from the viewpoint of balance between the decrease in the flexural strength and the improvement in the reflectance. For an application to an LED element package, it is required to further improve the reflectance while maintaining a high flexural strength.

Patent Document 3 discloses a conventional LTCC for a wiring board, which contains a zirconia filler having a high refractive index and further has a high flexural strength. However, such an LTCC realizes high strength by crystallizing the glass phase. In general, an LTCC of a type that the glass phase is crystallized, tends to have such problems that there is a difference in the amount of deposition of crystals between the front side and the rear side, a large amount of crystals will deposit on an interface with a wiring member, thus leading to warpage of the substrate. The warpage of the substrate depends on the thickness and the shape of the substrate, and for an application to an LED package for which demands for package design of various shapes are estimated, the degree of crystallinity of glass is preferably low.

Patent Document 1: JP-A-2006-206378
Patent Document 2: JP-A-2007-129191
Patent Document 3: JP-A-1999-043369

SUMMARY OF THE INVENTION

It is an object of the present invention to provide a glass ceramic material composition for a low temperature co-fired glass ceramic substrate having a high flexural strength and a high reflectance with a low degree of crystallinity of the glass phase.

The present inventors have conducted extensive studies to solve the above problems and as a result, found that a glass ceramic composition having a certain specific glass composition of $SiO_2$—$Al_2O_3$—$B_2O_3$—$CaO$ type, an alumina filler and a high refractive index filler combined, is a glass ceramic material composition suitable for a low temperature co-fired ceramic substrate having a high flexural strength and a high reflectance with a low degree of crystallinity of the glass phase. The present invention has been accomplished on the basis of this discovery.

That is, the present invention provides a ceramic material composition comprising from 20 to 50 mass % of a borosilicate glass powder, from 25 to 55 mass % of an alumina filler powder and from 10 to 45 mass % of a filler powder (hereinafter referred to simply as "a high refractive index filler powder") having a refractive index higher than the alumina filler powder, wherein the borosilicate glass powder comprises, as calculated as oxides, from 30 to 70 mass % of $SiO_2$, from 5 to 28 mass % of $B_2O_3$, from 5 to 30 mass % of $Al_2O_3$, from 3 to 35 mass % of CaO, from 0 to 25 mass % of SrO, from 0 to 25 mass % of BaO, from 0 to 10 mass % of $Na_2O$, from 0 to 10 mass % of $K_2O$, from 0.5 to 10 mass % of $Na_2O$+$K_2O$ and from 3 to 40 mass % of CaO+SrO+BaO, and satisfies the following conditions:

in the borosilicate glass powder, as represented by mass %, the value of "three times the $B_2O_3$ content"+"twice (the CaO content+the SrO content+the BaO content)"+"ten times (the $Na_2O$ content+the $K_2O$ content)", is within a range of from 105 to 165.

By using the glass ceramic material composition according to the present invention, a ceramic substrate having a high reflectance can be prepared. When the ceramic substrate is utilized for a package for an LED element, light from the LED element can efficiently be brought to the front side. Further, the ceramic substrate has a very high flexural strength, and is thereby less likely to undergo breakage or chipping in the processing. Further, by using the glass ceramic material composition according to the present invention, the ceramic substrate with small warpage, etc., can be obtained at a relatively low firing temperature (typically from 850° C. to 900° C.), and the co-firing with an Ag conductor can be carried out, whereby mass production of the package for an LED element at a low cost is possible.

DETAILED DESCRIPTION OF THE PREFERRED EMBODIMENTS

Now, the present invention will be described in detail with reference to preferred embodiments, but it should be understood that the present invention is by no means restricted thereto.

The glass ceramic composition of the present invention (hereinafter referred to simply as "a composition of the present invention") usually comprises a powder of the above borosilicate glass (hereinafter the glass to be used for the composition of the present invention will be referred to as "glass of the present invention"), an alumina filler powder and a high refractive index filler powder (typically e.g. a titania filler or a zirconia filler). Here, the refractive index of the alumina filler powder is about 1.8, whereas the refractive indices of the titania filler powder and the zirconia filler powder are respectively about 2.7 and 2.2. The composition of the present invention is usually used as a green sheet.

That is, first, the composition of the present invention and a resin such as a polyvinyl butyral or an acrylic resin, and as the case requires, a plasticizer such as dibutyl phthalate, dioctyl phthalate or butylbenzyl phthalate, etc., are mixed. Then, a solvent such as toluene, xylene or butanol is added to obtain a slurry, which is formed into a sheet by a doctor blade method or the like on a film of e.g. polyethylene terephthalate. Finally, the sheet-formed product is dried to remove the solvent thereby to obtain a green sheet. On such a green sheet, as the case requires, a wiring pattern or via as a through hole conductor, etc. are formed by e.g. screen printing using an Ag paste, an Ag conductor or the like. Further, it is possible to form overcoat glass to protect e.g. the wiring formed by Ag, e.g. by screen printing as the case requires.

The above green sheet is fired and then processed into a desired shape to obtain a substrate. In such a case, one green sheet or a plurality of green sheets laminated are fired. The substrate is a substrate for an LED element package of the present invention, and firing is typically carried out by holding the green sheet(s) at from 850 to 900° C. for from 20 to 60 minutes. The firing temperature is more typically from 860 to 880° C.

In a case where a wiring pattern or a through hole conductor is formed in the interior of the fired product i.e. the substrate by co-firing with an Ag paste or the like, the firing temperature is preferably at most 880° C. If the firing temperature exceeds 880° C., silver or the Ag-containing conductor may be softened at the time of firing, whereby the shape of the wiring pattern or the through hole conductor may not be maintained, and the firing temperature is more preferably at most 870° C.

The composition of the present invention preferably contains from 20 to 50 mass % of a powder of the glass of the present invention, from 25 to 55 mass % of an alumina filler powder and from 10 to 45 mass % of a high refractive index filler powder.

If the content of the powder of the glass of the present invention is less than 20 mass %, firing tends to be insufficient, and it may be difficult to obtain a dense substrate. The content is preferably at least 25 mass %, more preferably at least 30 mass %. Further, if it exceeds 50 mass %, the flexural strength of the substrate may be insufficient. It is preferably at most 47%, more preferably at most 45%.

The alumina filler powder is a component to increase the flexural strength of the substrate. If its content is less than 25 mass %, it will be difficult to realize a desired flexural strength. The content is preferably at least 30 mass %, more preferably at least 35 mass %. On the other hand, if the content of the alumina filler powder exceeds 55 mass %, the firing tends to be insufficient, whereby it will be difficult to obtain a dense substrate, or smoothness on the surface of the substrate may be impaired. The content is preferably at most 50 mass %, more preferably at most 45 mass %.

The high refractive index filler powder is a component to improve the reflectance of the substrate. If the content of the high refractive index filler powder is less than 10 mass %, it will be difficult to realize a desired reflectance. It is preferably at least 15 mass %, more preferably at least 20 mass %. On the other hand, if it exceeds 45 mass %, it will be difficult to obtain a dense substrate by firing. It is preferably at most 40 mass %, more preferably at most 35 mass %.

In order to obtain a sufficient reflectance by the high refractive index filler powder, the difference in the refractive index between the high refractive index filler powder and the glass powder is preferably at least 0.4. The refractive index of the glass of the present invention is at a level of from 1.5 to 1.6. Accordingly, the refractive index of the high refractive index filler is preferably higher than 1.95. It is more preferably at least 2.0, furthermore preferably at least 2.05. The refractive index here means a refractive index to light having a wavelength of 460 nm.

The high refractive index filler powder as a component of the composition of the present invention is typically titania, zirconia, stabilized zirconia or the like, but it is not limited thereto so long as it has a refractive index higher than 1.95. It may be a titanium compound such as barium titanate, strontium titanate or potassium titanate, or other composite containing titanium or zirconia as the main component. Further, its 50% particle size ($D_{50}$) is preferably from 0.05 to 5 μm. If $D_{50}$ is smaller than 0.05 μm, the size of the powder is too smaller than the wavelength (460 nm in the present invention) of light, and it is thereby difficult to obtain a sufficient reflectance. $D_{50}$ is more preferably at least 0.1 μm, furthermore preferably at least 0.15 μm. Further, if $D_{50}$ exceeds 5 μm, the size of the powder is too larger than the wavelength of light, and it is thereby difficult to obtain a sufficient reflectance. It is more preferably at most 3 μm, furthermore preferably at most 1.5 μm. In this specification, $D_{50}$ is a value measured by a laser diffraction scattering method.

Among industrially available high refractive index filler powders, there is one such that very small primary particles (typically 0.05 μm or smaller) are agglomerated to form relatively large secondary particles (typically at a level of from 0.05 μm to 5 μm), and in such a case, it is not the primary particle size but the secondary particle size that is important to achieve a desired reflectance. That is, in a case where the high refractive index filler powder comprises agglomerated particles, in order to achieve a desired reflectance, $D_{50}$ of the agglomerated particles is preferably from 0.05 to 5 μm. $D_{50}$ is more preferably at least 0.1 μm, furthermore preferably at least 0.15 μm. Further, it will be difficult to obtain a sufficient reflectance also if $D_{50}$ exceeds 5 μm. it is more preferably at most 3 μm, furthermore preferably at most 1.5 μm. $D_{50}$ of the above agglomerated particles is a value measured by a laser diffraction scattering method in the same manner as $D_{50}$ of a powder which is not agglomerated.

$D_{50}$ of the alumina filler powder is preferably from 0.3 to 5 μm. if $D_{50}$ is smaller than 0.3 μm, it will be difficult to achieve a sufficient flexural strength. $D_{50}$ is more preferably at least 0.6 μm, furthermore preferably at least 1.5 μm. On the other hand, if $D_{50}$ exceeds 5 μm, the smoothness on the surface of the substrate will be impaired, or it will be difficult to obtain a dense fired product. $D_{50}$ is more preferably at most 4 μm, furthermore preferably at most 3 μm.

The powder of the glass of the present invention is usually produced by grinding glass obtained by a melting method. The grinding method is not particularly limited so long as the object of the present invention is not impaired, and may be either wet grinding or dry grinding. In the case of wet grinding, it is preferred to use water as a solvent. Further, for grinding, a grinding machine such as a roll mill, a ball mill or a jet mill may suitably be used. The glass after grinding is dried and classified as the case requires.

$D_{50}$ of the glass powder of the present invention is preferably from 0.5 to 5 μm. If $D_{50}$ is smaller than 0.5 μm, the cost will be high in the case of industrial production. $D_{50}$ is more preferably at least 0.8 μm, furthermore preferably at least 1.5 μm. If $D_{50}$ exceeds 5 μm, it will be difficult to obtain a dense fired product by firing. It is more preferably at most 4 μm, furthermore preferably at most 3 μm.

Now, the component of the glass of the present invention will be described.

$SiO_2$ is a component to stabilize glass and is essential. The $SiO_2$ content is preferably at least 30 mass %. If it is less than 30 mass %, stable glass is hardly obtained, crystals are likely to deposit at the time of firing, and the substrate is likely to be warped. The $SiO_2$ content is more preferably at least 35 mass %. On the other hand, the $SiO_2$ content is preferably at most 70 mass %. If it exceeds 70 mass %, melting properties will be impaired, and it will be difficult to produce homogeneous glass at a low cost. The $SiO_2$ content is more preferably at most 63 mass %.

$B_2O_3$ is a component to facilitate sintering of glass and is essential. The $B_2O_3$ content is preferably at least 5 mass %. If it is less than 5 mass %, sintering will be insufficient, and it will be difficult to obtain a dense substrate. The $B_2O_3$ content is more preferably at least 5.5 mass %, more preferably at least 6.0 mass %. On the other hand, the $B_2O_3$ content is preferably at most 28 mass %. If it exceeds 28 mass %, the glass is likely to undergo phase separation when it is melted. Glass which is likely to undergo phase separation is not suitable for stable mass production. The $B_2O_3$ content is more preferably at most 24 mass %, furthermore preferably at most 20 mass %.

$Al_2O_3$ is a component to stabilize glass and is essential. The $Al_2O_3$ content is preferably at least 5 mass %. If the $Al_2O_3$ content is less than 5 mass %, glass is likely to undergo phase separation. It is more preferably at least 6 mass %, furthermore preferably at least 7 mass %. On the other hand, the $Al_2O_3$ content is preferably at most 30 mass %. If the $Al_2O_3$ content exceeds 30 mass %, crystals represented by anorthite ($SiO_2$—$Al_2O_3$—$CaO$) will deposit at the time of firing, and the substrate is likely to be warped at the time of firing. The $Al_2O_3$ content is more preferably less than 25 mass %, furthermore preferably less than 23 mass %.

CaO is a component to decrease the glass melting temperature and to facilitate sintering as well, and is essential. The CaO content is preferably at least 3 mass %. If the CaO content is less than 3 mass %, sintering will be insufficient, and it will be difficult to obtain a dense substrate. The CaO content is more preferably at least 4 mass %, furthermore preferably at least 5 mass %. On the other hand, the CaO content is preferably at most 35 mass %. If it exceeds 35 mass %, crystals represented by anorthite ($SiO_2$—$Al_2O_3$—$CaO$) will deposit, and the substrate is likely to be warped at the time of firing. It is more preferably at most 32 mass %, furthermore preferably at most 30 mass %.

SrO and BaO are, like CaO, components to decrease the melting temperature and to facilitate sintering as well, and some of CaO may be replaced with SrO or BaO. However, such components have a strong tendency to facilitate crystallization as compared with CaO, and accordingly in a case where some of CaO is replaced with SrO or BaO, the SrO and BaO contents must be at most 25 mass %, respectively. The SrO and BaO contents are more preferably at most 22 mass % and at most 17 mass %, respectively.

The content of CaO+SrO+BaO (hereinafter sometimes referred to as RO) is preferably at least 3 mass %. If the RO content is less than 3 mass %, sintering will be insufficient, and it will be difficult to obtain a dense substrate. The RO content is more preferably at least 7 mass %, furthermore preferably at least 10 mass %. Further, the RO content is preferably at most 40 mass %. If the RO content exceeds 40 mass %, crystals will deposit at the time of firing, and the substrate is likely to be warped. The RO content is more preferably at most 35 mass %, furthermore preferably at most 30 mass %.

$Na_2O$ and $K_2O$ are components to improve sintering properties, and at least one of them must be contained. The total content $Na_2O$+$K_2O$ (hereinafter sometimes referred to as $R_2O$) is preferably at least 0.5 mass %. If the $R_2O$ content is less than 0.5 mass %, the melting properties or the sintering properties of the glass may be impaired. The $R_2O$ content is more preferably at least 0.6 mass %, furthermore preferably at least 0.8 mass %. On the other hand, the $R_2O$ content is preferably at most 10 mass %. If the $R_2O$ content exceeds 10 mass %, crystallization is likely to occur, or the electrical insulating properties of the fired product may be decreased. It is more preferably at most 9 mass %, furthermore preferably at most 8 mass %.

The $Na_2O$ content is preferably within a range of from 0 to 10 mass %. If the $Na_2O$ content exceeds 10 mass %, crystallization is likely to occur at the time of firing, or the electrical insulating properties of the fired product may be decreased. It is more preferably at most 9 mass %, furthermore preferably at most 8 mass %. The $K_2O$ content is preferably within a range of from 0 to 10 mass %. If the $K_2O$ content exceeds 10 mass %, crystallization or phase separation is likely to occur at the time of firing, or the electrical insulating properties of the fired product may be decreased. It is more preferably at most 5 mass %, furthermore preferably at most 2.5 mass %.

It is preferred that substantially no $Fe_2O_3$ is contained. If $Fe_2O_3$ is contained, its content must be at most 0.05 mass %. If it exceeds 0.05 mass %, $Fe_2O_3$ absorbs light at 460 nm, and the reflectance at this wavelength will be decreased. The content is more preferably at most 0.04 mass %, furthermore preferably at most 0.03 mass %.

The present inventors have found that the component ratio of $B_2O_3$, RO and $R_2O$ is very important to realize an LTCC which has a high flexural strength and a high reflectance, which has a low degree of crystallinity and which is capable of stable mass production. The concept will be described below. First, in order to realize a high reflectance of the LTCC, it is necessary to add a high refractive index filler powder of e.g. zirconia or titania to the LTCC. However, if such a high refractive index filler powder is added, in general, the sintering properties of the LTCC will be decreased, thus leading to insufficient sintering, whereby the flexural strength will be decreased.

Accordingly, in the present invention, it has been attempted to increase components to increase the sintering properties such as $B_2O_3$, RO and $R_2O$, as compared with a conventional glass composition. In order to obtain desired sintering properties, the total amount of such components must be sufficiently large. However, if only a certain specific component is increased, the glass is likely to be crystallized at the time of firing, or it is likely to undergo phase separation at the time of melting. Further, the chemical durability may be remarkably impaired.

Accordingly, in order to obtain desired properties, the respective components of $B_2O_3$, RO and $R_2O$ should be increased with good balance to efficiently improve the sintering properties. Accordingly, the present inventors have first experimentally studied the degree of influence of the respective components of $B_2O_3$, RO and $R_2O$ over the sintering properties. As a result, the present inventors have found that the proportion of the degree of influence of these components over the sintering properties is approximately $B_2O_3$:RO:$R_2O$=3:2:10, and found it possible to employ the value of $3B_2O_3+2RO+10R_2O$ as the index of the sintering properties. The glass composition of the present invention has a high value of $3B_2O_3+2RO+10R_2O$ as compared with a conventional glass composition for an amorphous LTCC, and has improved sintering properties.

The value of $3B_2O_3+2RO+10R_2O$ is a value calculated based on the contents contained in the glass composition as represented by mass %. This value is preferably at least 105. If the value of $3B_2O_3+2RO+10R_2O$ is less than 105, sintering will be insufficient, thus leading to a decrease in the strength. It is more preferably at least 112, furthermore preferably at least 114. On the other hand, if the value of $3B_2O_3+2RO+10R_2O$ exceeds 165, the glass is likely to crystallize at the time of firing, or the glass is likely to undergo phase separation at the time of melting. The value of $3B_2O_3+2RO+10R_2O$ is more preferably at most 155, furthermore preferably at most 150.

The glass of the present invention essentially comprises the above components, but may contain other component within a range not to impair the object of the present invention. For example, as the case requires, $Li_2O$ may be used instead of $Na_2O$ or $K_2O$. In such a case, the $Li_2O$ content is preferably at most 8 mass %. If the $Li_2O$ content exceeds 8 mass %, the glass is likely to undergo phase separation. It is more preferably at most 6 mass %, furthermore preferably at most 4 mass %. Further, it is also possible to use MgO or ZnO instead of CaO, SrO or BaO. In such a case, the MgO and ZnO contents are preferably at most 10 mass %, respectively. If the MgO or ZnO content exceeds 10 mass %, crystals are likely to deposit at the time of firing. Their contents are more preferably at most 5 mass %, furthermore preferably at most 2 mass %, respectively. Further, for the purpose of improving the chemical durability, $ZrO_2$, $La_2O_3$, $Gd_2O_3$, etc. may be contained. In such a case, their contents are preferably at most 10 mass %. They are more preferably at most 7 mass %, furthermore preferably at most 5 mass %. Considering the load to the environment, the glass of the present invention contains no PbO.

Further, as described above, the glass of the present invention is required to have high acid resistance in some cases. In such a case, preferred is glass comprising, as calculated as oxides, from higher than 55 to 70 mass % of $SiO_2$, from 5 to 15 mass % of $B_2O_3$, from 5 to 15 mass % of $Al_2O_3$, from 3 to 20 mass % of CaO, from 0 to 10 mass % of SrO, from 0 to 10 mass % of BaO, from 0 to 10 mass % of $Na_2O$, from 0 to 10 mass % of $K_2O$, from 3 to 20 mass % of CaO+SrO+BaO and from 4 to 10 mass % of $Na_2O+K_2O$, and having a value, as represented by mass %, of "three times the $B_2O_3$ content"+"twice (the content of CaO+SrO+BaO)"+"ten times (the $Na_2O$ content+the $K_2O$ content)" within a range of from 105 to 140. Hereinafter, such glass will be referred to as "glass A of the present invention".

Further, in a case where the glass is not required to have high acid resistance, from the viewpoint of mass productivity such as melting properties of glass, preferred is glass comprising from 30 to 55 mass % of $SiO_2$, from 10 to 28 mass % of $B_2O_3$, from 5 to 30 mass % of $Al_2O_3$, from 3 to 35 mass % of CaO, from 0 to 25 mass % of SrO, from 0 to 25 mass % of BaO, from 0 to 10 mass % of $Na_2O$, from 0 to 10 mass % of $K_2O$, from 0.5 to 10 mass % of $Na_2O+K_2O$ and from 10 to 40 mass % of CaO+SrO+BaO, and having a value, as represented by mass %, of "three times the $B_2O_3$ content"+"twice (the content of CaO+SrO+BaO)"+"ten times (the $Na_2O$ content+the $K_2O$ content)" within a range of from 105 to 165. Hereinafter, such glass will be referred to as "glass B of the present invention".

Now, the concept of "glass A of the present invention" will be described. First, a component most important to the improvement of acid resistance is $SiO_2$. In order to realize glass having high acid resistance, it is required to increase $SiO_2$ as far as possible. However, if the amount of $SiO_2$ is too increased, the value of $3B_2O_3+2RO+10R_2O$ will be small, whereby the sintering properties will be impaired, and as a result, it will be difficult to maintain a high flexural strength. Accordingly, in order to satisfy both high acid resistance and high flexural strength, it is required to increase the value of $3B_2O_3+2RO+10R_2O$ while increasing the amount of $SiO_2$. In order to increase the value of $B_2O_3+2RO+10R_2O$, three ways of an increase of $B_2O_3$, an increase of RO and an increase of $R_2O$ are conceivable, and an increase of $R_2O$ is most preferred, since if desired sintering properties are to be obtained by an increase of $B_2O_3$ or RO which provides a relatively low degree of influence over the sintering properties, it is necessary to substantially increase the amount of $B_2O_3$ or RO, and as a result, the amount of $SiO_2$ is relatively reduced, whereby the acid resistance will be impaired. That is, within the composition range of "the glass of the present invention", glass having a composition with large amounts of $SiO_2$ and $R_2O$ and small amounts of $B_2O_3$ and RO is "glass A of the present invention".

Now, the respective components of "glass A of the present invention" will be described.

$SiO_2$ is a component to improve the acid resistance and is essential. $SiO_2$ is contained preferably in a content higher than 55 mass %. If the $SiO_2$ content is at most 55 mass %, it will difficult to obtain desired acid resistance. It is more preferably at least 57 mass %, furthermore preferably at least 58 mass %. On the other hand, the $SiO_2$ content is preferably at most 70 mass %. If it exceeds 70 mass %, the melting properties will be impaired, and it will be difficult to produce homogeneous glass at a low cost. The $SiO_2$ content is more preferably at most 65 mass %, furthermore preferably at most 63 mass %.

$B_2O_3$ is a component to facilitate sintering of glass and is essential. The $B_2O_3$ content is preferably at least 5 mass %. If it is less than 5 mass %, sintering will be insufficient, and it will be difficult to obtain a dense substrate. The $B_2O_3$ content is more preferably at least 5.5 mass %, furthermore preferably at least 6.0 mass %. On the other hand, the $B_2O_3$ content is preferably at most 15 mass %. If the $B_2O_3$ content exceeds 15 mass %, it will be difficult to obtain desired acid resistance. It is more preferably at most 13 mass %, furthermore preferably at most 10.5 mass %.

$Al_2O_3$ is a component to stabilize glass and is essential. The $Al_2O_3$ content is preferably at least 5 mass %. If the $Al_2O_3$ content is less than 5 mass %, glass is likely to undergo phase separation. Glass which undergoes phase separation is not suitable for stable mass production. The $Al_2O_3$ content is more preferably at least 6 mass %. On the other hand, the $Al_2O_3$ content is preferably at most 15 mass %. If the $Al_2O_3$ content exceeds 15 mass %, it will be difficult to obtain desired acid resistance. The $Al_2O_3$ content is more preferably at most 13 mass %, furthermore preferably at most 10 mass %.

CaO is a component to decrease the glass melting temperature and to facilitate sintering as well, and is essential. The CaO content is preferably at least 3 mass %. If the CaO content is less than 3 mass %, sintering will be insufficient, and it will be difficult to obtain a dense substrate. The CaO content is more preferably at least 7 mass %, furthermore preferably at least 10 mass %. On the other hand, the CaO content is preferably at most 20 mass %. If it exceeds 20 mass %, it will be difficult to obtain desired acid resistance. It is more preferably at most 18 mass %, furthermore preferably at most 17 mass %.

SrO and BaO are, like CaO, components to decrease the melting temperature and to facilitate sintering as well, and some of CaO may be replaced with SrO or BaO. However, such components tend to deteriorate the acid resistance as compared with CaO, and accordingly in a case where some of CaO is replaced with SrO or BaO, the SrO and BaO contents must be at most 10 mass %, respectively. The SrO and BaO contents are more preferably at most 5 mass %, furthermore preferably at most 3 mass %, respectively.

The content of CaO+SrO+BaO (hereinafter sometimes referred to as RO) is preferably at least 3 mass %. If the RO content is less than 3 mass %, sintering will be insufficient, and it will be difficult to obtain a dense substrate. The RO content is more preferably at least 7 mass %, furthermore preferably at least 10 mass %. Further, the RO content is preferably at most 20 mass %. If the RO content exceeds 20 mass %, it will be difficult to obtain desired acid resistance. The RO content is more preferably at most 19 mass %, furthermore preferably at most 18 mass %.

$Na_2O$ and $K_2O$ are components to improve sintering properties, and at least one of them must be contained. The total content $Na_2O+K_2O$ (hereinafter sometimes referred to as $R_2O$) is preferably at least 4.0 mass %. If the $R_2O$ content is less than 4.0 mass %, the melting properties or the sintering properties of the glass may be impaired. The $R_2O$ content is more preferably at least 5.0 mass %, furthermore preferably at least 6.0 mass %. On the other hand, the $R_2O$ content is preferably at most 10 mass %. If the $R_2O$ content exceeds 10 mass %, crystallization is likely to occur, or the electrical insulating properties of the fired product may be decreased. It is more preferably at most 9 mass %, furthermore preferably at most 8 mass %.

The $Na_2O$ content is preferably within a range of from 0 to 10 mass %. If the $Na_2O$ content exceeds 10 mass %, crystallization is likely to occur at the time of firing, or the electrical insulating properties of the fired product may be decreased. It is more preferably at most 9 mass %, furthermore preferably at most 8 mass %. The $K_2O$ content is preferably within a range of from 0 to 10 mass %. If the $K_2O$ content exceeds 10 mass %, crystallization is likely to occur at the time of firing, or the electrical insulating properties of the fired product may be decreased. It is more preferably at most 5 mass %, furthermore preferably at most 2.5 mass %.

It is preferred that substantially no $Fe_2O_3$ is contained. If $Fe_2O_3$ is contained, its content must be at most 0.05 mass %. If it exceeds 0.05 mass %, $Fe_2O_3$ absorbs light at 460 nm, and the reflectance at this wavelength will be decreased. It is more preferably at most 0.04 mass %, furthermore preferably at most 0.03 mass %.

The value of $3B_2O_3+2RO+10R_2O$ is preferably from 105 to 140. If the value of $3B_2O_3+2RO+10R_2O$ is less than 105, sintering will be insufficient, thus leading to a decrease in the strength. It is more preferably at least 112, furthermore preferably at least 114. On the other hand, if the value of $3B_2O_3+2RO+10R_2O$ exceeds 140, glass A of the present invention is likely to crystallize at the time of firing, or it is likely to undergo phase separation at the time of melting. The value of $3B_2O_3+2RO+10R_2O$ is more preferably at most 130, furthermore preferably at most 125.

Now, "glass B of the present invention" will be described. In "glass B of the present invention" which is not particularly required to have high acid resistance, the amount of $SiO_2$ can be reduced as compared with "glass A of the present invention". Further, by reducing $SiO_2$, the melting properties of the glass will be improved, whereby it is possible to produce homogeneous glass at a lower cost. From the viewpoint of the melting properties of glass, the $SiO_2$ content is preferably at most 55 mass %. The $SiO_2$ content is more preferably at most 54 mass %, furthermore preferably at most 53 mass %. Further, the $SiO_2$ content is preferably at least 30 mass %. If it is less than 30 mass %, stable glass is hardly obtainable, crystals will deposit at the time of firing, and the substrate is likely to be warped. The $SiO_2$ content is more preferably at least 35 mass %.

$B_2O_3$ is a component to facilitate sintering of glass and is essential. The $B_2O_3$ content is preferably at least 10 mass %. The $B_2O_3$ content is more preferably at least 11 mass %, furthermore preferably at least 12 mass %. On the other hand, the $B_2O_3$ content is preferably at most 28 mass %. If it exceeds 28 mass %, glass is likely to undergo phase separation at the time of melting. Glass which is likely to undergo phase separation is not suitable for stable mass production. The $B_2O_3$ content is more preferably at most 24 mass %, furthermore preferably at most 20 mass %.

$Al_2O_3$ is a component to stabilize glass and is essential. The $Al_2O_3$ content is preferably at least 5 mass %. If the $Al_2O_3$ content is less than 5 mass %, glass is likely to undergo phase separation. It is more preferably at least 6 mass %, furthermore preferably at least 7 mass %. On the other hand, the $Al_2O_3$ content is preferably at most 30 mass %. If the $Al_2O_3$ content exceeds 30 mass %, crystals represented by anorthite ($SiO_2$—$Al_2O_3$—CaO) will deposit at the time of firing, and the substrate is likely to be warped at the time of firing. The $Al_2O_3$ content is more preferably less than 25 mass %, furthermore preferably less than 23 mass %.

CaO is a component to decrease the glass melting temperature and to facilitate sintering as well, and is essential. The CaO content is preferably at least 3 mass %. If the CaO content is less than 3 mass %, sintering will be insufficient, and it will be difficult to obtain a dense substrate. The CaO content is more preferably at least 4 mass %, furthermore preferably at least 5 mass %. On the other hand, the CaO content is preferably at most 35 mass %. If it exceeds 35 mass %, crystals represented by anorthite ($SiO_2$—$Al_2O_3$—CaO) will deposit, and the substrate is likely to be warped at the time of firing. It is more preferably at most 32 mass %, furthermore preferably at most 30 mass %.

SrO and BaO are, like CaO, components to decrease the melting temperature and to facilitate sintering as well, and some of CaO may be replaced with SrO or BaO. However, such components have a strong tendency to facilitate crystallization as compared with CaO, and accordingly in a case where some of CaO is replaced with SrO or BaO, the SrO and BaO contents must be at most 25 mass %, respectively. The SrO and BaO contents are more preferably at most 22 mass % and 17 mass %, respectively.

The content of CaO+SrO+BaO (hereinafter sometimes referred to as RO) is preferably at least 10 mass %. The RO content is more preferably at least 15 mass %, furthermore preferably at least 17 mass %. Further, the RO content is preferably at most 40 mass %. If the RO content exceeds 40 mass %, crystals will deposit at the time of firing, and the substrate is likely to be warped. The RO content is more preferably at most 35 mass %, furthermore preferably at most 30 mass %.

$Na_2O$ and $K_2O$ are components to improve sintering properties, and at least one of them must be contained. The total content $Na_2O+K_2O$ (hereinafter sometimes referred to as $R_2O$) is preferably at least 0.5 mass %. If the $R_2O$ content is less than 0.5 mass %, the melting properties or the sintering properties of the glass may be impaired. The $R_2O$ content is more preferably at least 0.6 mass %, furthermore preferably at least 0.8 mass %. On the other hand, the $R_2O$ content is preferably at most 10 mass %. If the $R_2O$ content exceeds 10 mass %, crystallization is likely to occur, or the electrical insulating properties of the fired product may be decreased. It is more preferably at most 9 mass %, furthermore preferably at most 8 mass %.

The $Na_2O$ content is preferably within a range of from 0 to 10 mass %. If the $Na_2O$ content exceeds 10 mass %, crystallization is likely to occur at the time of firing, or the electrical insulating properties of the fired product may be decreased. It is more preferably at most 9 mass %, furthermore preferably at most 8 mass %. The $K_2O$ content is preferably within a range of from 0 to 10 mass %. If the $K_2O$ content exceeds 10 mass %, crystallization or phase separation is likely to occur at the time of firing, or the electrical insulating properties of the fired product may be decreased. It is more preferably at most 5 mass %, furthermore preferably at most 2.5 mass %.

It is preferred that substantially no $Fe_2O_3$ is contained. If $Fe_2O_3$ is contained, its content must be at most 0.05 mass %. If it exceeds 0.05 mass %, $Fe_2O_3$ absorbs light at 460 nm, and the reflectance at this wavelength will be decreased. It is more preferably at most 0.04 mass %, furthermore preferably at most 0.03 mass %.

The value of $3B_2O_3+2RO+10R_2O$ is preferably from 105 to 165. If the value of $3B_2O_3+2RO+10R_2O$ is less than 105, sintering will be insufficient, thus leading to a decrease in the strength. It is more preferably at least 112, furthermore preferably at least 114. On the other hand, if the value of $3B_2O_3+2RO+10R_2O$ exceeds 165, the glass is likely to crystallize at the time of firing, or it is likely to undergo phase separation at the time of melting. The value of $3B_2O_3+2RO+10R_2O$ is more preferably at most 155, furthermore preferably at most 150.

Now, the present invention will be described in detail with reference to Examples. However, it should be understood that the present invention is by no means restricted to such specific Examples.

Raw materials were blended and mixed so as to achieve a composition represented by mass % in columns for from $SiO_2$ to $ZrO_2$ in Table 1, and the mixed raw materials were put in a platinum crucible and melted at from 1,500 to 1,600° C. for 60 minutes, and then the molten glass was cast and cooled to obtain glass blocks having compositions A to R as identified in Table 1. Further, part of the obtained glass was ground by a ball mill made of alumina using water as a solvent for from 20 to 60 hours to obtain glass powders A to R in Table 1. Here, in Table 1, A to M are glasses for an LTCC substrate having a high flexural strength and a high reflectance according to the present invention. Whereas, in Table 1, N to R are comparative glass compositions. N, O and P are glass compositions used as sample Nos. 4, 6 and 9 disclosed in JP-A-2006-206378, Q is a glass composition of glass No. 17 disclosed in JP-A-2007-129191, and R is a glass composition disclosed in Example 2 of JP-A-2005-179079. Further, with respect to the compositions disclosed in JP-A-2006-206378, since the total of components is not 100%, calculated values so that the total of the components becomes 100% are shown in Table 1. Further, $D_{50}$ (unit: μm) of the obtained glass powders was measured by a laser diffraction type particle size distribution measuring apparatus (SALD2100) manufactured by Shimadzu Corporation, and all the glass powders had $D_{50}$ of 2.0 μm.

Each of the obtained glass blocks was observed visually or by a microscope (magnification: 100 times), and evaluated based on the evaluation standards x: cloudiness due to phase separation observed, and ○: no cloudiness observed, shown in a column for "phase separation" in Table 1.

The softening point (° C.) of each glass powder was measured using a thermal analyzer TG-8110 manufactured by Rigaku Corporation at a temperature-raising rate of 10° C./min up to 1,000° C. The results are shown in a column for "softening point" in Table 1. The softening point is preferably at most 860° C.

100 g of a powder mixture comprising 40 g of each glass powder and 60 g of an alumina filler powder was kneaded with 35 g of an organic vehicle having 10 mass % of ethyl cellulose dissolved in α-terpineol or the like to prepare a paste containing glass and alumina. This paste was uniformly applied by screen printing so that the thickness after firing would be 20 μm on an alumina ceramic substrate having a size of 5 mm×5 mm, and dried at 120° C. for 10 minutes. In these Examples, as the alumina powder, AL47-H ($D_{50}$=2.1 μm) manufactured by Showa Denko K.K. was used.

Firing shrinkage properties of a paste-dried film containing the alumina filler powder and the glass powder obtained by the above method were measured by using a thermomechanical analyzer TMA-50 manufactured by Shimadzu Corporation at a temperature-raising rate of 10° C./min up to 1,000° C. The firing completion temperature estimated from the obtained shrinkage curve is shown in "glass-alumina composite shrinkage completion point (° C.)" in Table 1. The glass-alumina composite shrinkage completion point (° C.) is a value to simply evaluate comprehensive sintering properties including various factors such as wettability between glass and alumina, and the softening point of the glass, and a glass composition having a lower glass-alumina composite shrinkage completion point has higher sintering properties. The glass-alumina composite shrinkage completion point (° C.) is preferably at most 900° C. When the glass-alumina composite shrinkage completion point is at most 900° C., the composite has sufficiently high sintering properties, and accordingly a dense fired substrate can be still obtained even if the sintering properties are somewhat impaired by addition of a desired amount of the high refractive index filler powder. On the other hand, if the glass-alumina composite shrinkage completion point exceeds 900° C., the composite has insufficient shrinkage properties, and accordingly it will be difficult to obtain a dense fired substrate if the sintering properties are further impaired by addition of a desired amount of the high refractive index filler powder.

As evident from Table 1, the glass of the present invention has a higher value of $3B_2O_3+2RO+10R_2O$ than that of a conventional glass for an LTCC, and has a low glass-alumina composite shrinkage completion point (° C.) i.e. high sintering properties. Further, the glass R as a Comparative Example has a small amount of $Al_2O_3$ and underwent phase separation when the glass was cooled after melted.

With 50 g of a powder mixture of the glass powder prepared in Table 1 and a ceramic powder of e.g. partially stabilized zirconia or titania in a mass percentage shown in Table 2, 15 g of an organic solvent (a mixture of toluene, xylene, 2-propanol and 2-butanol in a mass ratio of 4:2:2:1), 2.5 g of a plasticizer (di-2-ethylhexyl phthalate), 5 g of a resin (polyvinyl butyral PVK#3000K manufactured by DENKA) and a dispersing agent (DISPER BYK180 manufactured by BYK Japan K.K.) were mixed to prepare a slurry. This slurry was applied on a PET film by a doctor blade method, and the coating film was dried to obtain a green sheet having a thickness of 0.2 mm. In these Examples, as the partially stabilized zirconia powder, HSY-3F-J ($D_{50}$=0.56 μm) manufactured by Daiichi Kigenso Kagaku Kogyo Co., Ltd. was used, and as the titania powder, HT0210 ($D_{50}$=2.3 μm) manufactured by Toho Titanium Co., Ltd. was used except for Comparative Example 10, and HT1311 ($D_{50}$=0.60 μm) manufactured by Toho Titanium Co., Ltd. was used in Comparative Example 10.

The flexural strength was measured by the following method. That is, six such green sheets were laminated and held at 550° C. for 5 hours to remove the resin component by decomposition, and then held at 870° C. for 30 minutes to carry out firing to prepare a fired product for measuring the flexural strength. The fired product was cut into strips having a thickness of about 0.85 mm and a width of 5 mm, and 10 such strips were used to measure three-point flexural strength. The span was 15 mm, and the cross head speed was 0.5 cm/min. The measurement results are shown in a column for strength in Table 2 (unit: MPa). The flexural strength is preferably at least 280 MPa, more preferably at least 300 MPa.

Part of the sample used for evaluation of the flexural strength was polished and observed by an electron microscope S-3000H manufactured by Hitachi, Ltd., whereupon the degrees of crystallinity of the glass phase in the LTCC in all Examples 1 to 19 were at most 60% by the volume ratio. If the degree of crystallinity exceeds 60%, problems such as warpage are likely to arise at the time of firing. It is more preferably at most 35%, furthermore preferably at most 15%.

The reflectance was measured by the following method. That is, one square green sheet having a width at a level of 30 mm, a laminate of two such sheets and a laminate of three such sheets were fired to prepare three fired products having thicknesses at a level of 140 μm, 280 μm and 420 μm. The reflectance of each of the obtained three samples was measured by using a spectroscope USB2000 and a small integrating sphere ISP-RF each manufactured by Ocean Optics Inc. to calculate the reflectance (unit: %) of a fired product having a thickness of 300 μm by linear complementation regarding the thickness. The reflectance was at a wavelength of 460 nm, and barium sulfate was used as a reference. The results are shown in a column for the reflectance in Table 2. The reflectance is preferably at least 90%, more preferably at least 92%.

The acid resistance was measured by the following method. That is, six square green sheets having a width at a level of 40 mm were laminated to obtain a fired product having a thickness at a level of 0.85 mm. First, the weight of the obtained fired product was measured, and then the fired product was immersed in an oxalic acid solution having a pH of 1.68 at a temperature of 85° C. for one hour. After immersion, the fired product was taken out, subjected to ultrasonic cleaning and dried at 120° C. for one hour, and the weight of the fired product was measured. The weight before immersion in the acid solution and the weight after immersion were compared, the weight after immersion was subtracted from the weight before immersion, and the obtained value was divided by the surface area of the fired product, and the resulting value is shown in a column for "acid resistance" in Table 2. The higher the value of "acid resistance", the more the LTCC component elutes to the acid solution, and the worse the acid resistance. To obtain a practically sufficient acid resistance, the value of "acid resistance" is preferably at most 1,000 μg/cm².

As evident from Table 2, in Examples 1 to 19 which are Examples of the present invention, in which the glass of the present invention, the alumina filler powder and the high refractive index filler powder were mixed, the flexural strength is at least 280 MPa and the reflectance is at least 90%. Examples 20 to 29 are Comparative Examples. Examples 20 to 23 correspond to conventional LTCC containing no high refractive index filler powder. Although such an LTCC has a relatively high flexural strength of at least 280 MPa, but can hardly have a reflectance of at least 90%. Further, Example 24 corresponds to a composition used for the tape 6 in JP-A-2007-129191, and the composition comprises a glass powder, a titania filler powder and an alumina filler powder, but as the amount of the titania filler powder is at most 10 mass, no sufficient reflectance can be obtained. Further, the flexural strength is also low. In Examples 25 to 28, to conventional glass for an LTCC, partially stabilized zirconia is added as the high refractive index filler powder. Although the reflectance is sufficiently high, the flexural strength is low. Further, in Example 29, a titania filler powder is added to the glass of the present invention, but as the amount of the titania filler powder is at most 10 mass %, no sufficient reflectance can be obtained. Further, particularly Examples 11, 16 and 17 provide LTCC comprising "glass A of the present invention", and such an LTCC has a flexural strength of at least 280 MPa and a reflectance of at least 90% and has the value of acid resistance of at most 1,000 μg/cm².

Here, the glass composition at an amorphous portion in the LTCC substrate obtained by the present invention has a large amount of an alumina component as compared with the composition of the glass powder used as the raw material. This is because alumina elutes from the alumina filler powder to the amorphous portion. For example, in Table 3 are shown results of analysis of the composition at the amorphous portion from a cross section of the LTCC substrate having the composition in Example 12. By the elution from the alumina filler powder, the alumina amount in the composition at the amorphous portion in the LTCC substrate is increased by about 15 mass % as compared with the composition of the glass powder used as the raw material. Further, along with the increase of alumina, components other than alumina are substantially uniformly reduced. For the compositional analysis of the LTCC cross section, field emission electron probe microanalyzer (JXA-8500F) manufactured by JEOL Ltd. was used.

TABLE 1

| | $SiO_2$ | $B_2O_3$ | $Al_2O_3$ | MgO | CaO | SrO | BaO | $Li_2O$ | $Na_2O$ | $K_2O$ | $TiO_2$ | $ZrO_2$ | TOTAL | $3B_2O_3 + 2RO + 10R_2O$ | Glass softening point (°C.) | Glass-alumina composite shrinkage completion point (°C.) | Phase separation |
|---|---|---|---|---|---|---|---|---|---|---|---|---|---|---|---|---|---|
| A | 53.8 | 16.1 | 9.1 | 0.0 | 6.2 | 11.5 | 0.0 | 0.0 | 1.8 | 1.4 | 0.0 | 0.0 | 100 | 116 | 803 | 837 | ○ |
| B | 51.0 | 15.3 | 8.6 | 0.0 | 5.9 | 0.0 | 16.2 | 0.0 | 1.7 | 1.3 | 0.0 | 0.0 | 100 | 121 | 776 | 835 | ○ |
| C | 51.2 | 17.1 | 9.6 | 0.0 | 18.7 | 0.0 | 0.0 | 0.0 | 1.9 | 1.5 | 0.0 | 0.0 | 100 | 123 | 823 | 845 | ○ |
| D | 45.5 | 17.1 | 9.7 | 0.0 | 24.3 | 0.0 | 0.0 | 0.0 | 2.0 | 1.5 | 0.0 | 0.0 | 100 | 134 | 789 | 824 | ○ |
| E | 61.4 | 10.0 | 9.4 | 0.0 | 12.9 | 0.0 | 0.0 | 0.0 | 4.9 | 1.4 | 0.0 | 0.0 | 100 | 119 | 810 | 870 | ○ |
| F | 39.7 | 17.2 | 9.7 | 0.0 | 29.9 | 0.0 | 0.0 | 0.0 | 2.0 | 1.5 | 0.0 | 0.0 | 100 | 146 | 763 | 810 | ○ |
| G | 51.7 | 12.4 | 8.7 | 0.0 | 8.5 | 15.7 | 0.0 | 0.0 | 1.8 | 1.3 | 0.0 | 0.0 | 100 | 116 | 813 | 853 | ○ |
| H | 46.5 | 15.5 | 7.4 | 0.0 | 8.5 | 15.7 | 0.0 | 0.0 | 1.8 | 1.3 | 0.0 | 3.3 | 100 | 126 | 798 | 850 | ○ |
| I | 45.7 | 15.2 | 8.6 | 0.0 | 8.4 | 21.3 | 0.0 | 0.0 | 0.9 | 0.0 | 0.0 | 0.0 | 100 | 114 | 858 | 871 | ○ |
| J | 63.6 | 6.6 | 9.3 | 0.0 | 12.8 | 0.0 | 0.0 | 0.0 | 6.3 | 1.4 | 0.0 | 0.0 | 100 | 122 | 795 | 885 | ○ |
| K | 61.2 | 10.0 | 6.4 | 0.0 | 16.1 | 0.0 | 0.0 | 0.0 | 4.8 | 1.4 | 0.0 | 0.0 | 100 | 124 | 800 | 872 | ○ |
| L | 43.5 | 17.3 | 16.8 | 0.0 | 19.0 | 0.0 | 0.0 | 0.0 | 2.0 | 1.5 | 0.0 | 0.0 | 100 | 124 | 783 | 865 | ○ |
| M | 39.1 | 14.0 | 21.1 | 0.0 | 19.2 | 0.0 | 0.0 | 0.0 | 5.1 | 1.5 | 0.0 | 0.0 | 100 | 146 | 775 | 850 | ○ |
| N | 50.0 | 9.1 | 18.2 | 0.0 | 22.7 | 0.0 | 0.0 | 0.0 | 0.0 | 0.0 | 0.0 | 0.0 | 100 | 73 | 847 | 948 | ○ |
| O | 59.1 | 9.1 | 9.1 | 0.0 | 22.7 | 0.0 | 0.0 | 0.0 | 0.0 | 0.0 | 0.0 | 0.0 | 100 | 73 | 833 | 952 | ○ |
| P | 50.0 | 9.1 | 9.1 | 0.0 | 31.8 | 0.0 | 0.0 | 0.0 | 0.0 | 0.0 | 0.0 | 0.0 | 100 | 91 | 833 | 909 | ○ |
| Q | 54.5 | 8.3 | 12.7 | 1.0 | 16.6 | 2.9 | 0.0 | 0.2 | 1.5 | 2.2 | 0.0 | 0.0 | 100 | 103 | 811 | 910 | ○ |
| R | 57.0 | 19.0 | 3.0 | 7.0 | 8.0 | | 1.0 | | 0.5 | 0.5 | 2.0 | 2.0 | 100 | 85 | | | x |

TABLE 2

| | | Composition (mass %) | | | | | Evaluation results | | |
|---|---|---|---|---|---|---|---|---|---|
| | Glass | Glass | $ZrO_2$ | $TiO_2$ | $Al_2O_3$ | Total | Reflectance (%) | Strength (MPa) | Acid resistance (mg/cm²) |
| Ex. 1 | A | 36.4 | 24.5 | 0.0 | 39.1 | 100 | 95 | 358 | 1130 |
| Ex. 2 | A | 36.8 | 21.4 | 2.4 | 39.4 | 100 | 93 | 340 | 1200 |
| Ex. 3 | A | 37.7 | 13.3 | 7.5 | 41.6 | 100 | 90 | 300 | 1230 |
| Ex. 4 | B | 37.7 | 24.0 | 0.0 | 38.3 | 100 | 95 | 358 | 1700 |
| Ex. 5 | C | 35.8 | 24.7 | 0.0 | 39.5 | 100 | 95 | 320 | >2000 |
| Ex. 6 | D | 36.6 | 24.4 | 0.0 | 39.0 | 100 | 93 | 374 | >2000 |
| Ex. 7 | D | 35.4 | 23.6 | 0.0 | 41.0 | 100 | 95 | 368 | >2000 |
| Ex. 8 | D | 34.3 | 22.9 | 0.0 | 42.8 | 100 | 98 | 360 | >2000 |
| Ex. 9 | D | 37.6 | 16.7 | 0.0 | 45.7 | 100 | 91 | 380 | >2000 |
| Ex. 10 | D | 35.7 | 31.7 | 0.0 | 32.6 | 100 | 97 | 310 | >2000 |
| Ex. 11 | E | 35.6 | 24.8 | 0.0 | 39.6 | 100 | 95 | 358 | 420 |
| Ex. 12 | F | 37.3 | 24.1 | 0.0 | 38.5 | 100 | 94 | 337 | 1200 |
| Ex. 13 | G | 37.3 | 24.1 | 0.0 | 38.5 | 100 | 92 | 370 | >2000 |
| Ex. 14 | H | 35.6 | 24.8 | 0.0 | 39.6 | 100 | 94 | 325 | >2000 |
| Ex. 15 | I | 35.6 | 24.8 | 0.0 | 39.6 | 100 | 93 | 390 | >2000 |
| Ex. 16 | J | 35.3 | 24.9 | 0.0 | 39.8 | 100 | 93 | 320 | 683 |
| Ex. 17 | K | 35.6 | 24.8 | 0.0 | 39.6 | 100 | 93 | 300 | 928 |
| Ex. 18 | L | 35.9 | 24.7 | 0.0 | 39.4 | 100 | 94 | 320 | >2000 |
| Ex. 19 | M | 36.4 | 24.5 | 0.0 | 39.1 | 100 | 92 | 310 | >2000 |
| Ex. 20 | N | 39.8 | 0.0 | 0.0 | 60.2 | 100 | 85 | 250 | 50 |
| Ex. 21 | O | 40.6 | 0.0 | 0.0 | 59.4 | 100 | 85 | 268 | <10 |
| Ex. 22 | P | 39.4 | 0.0 | 0.0 | 60.6 | 100 | 76 | 304 | 270 |
| Ex. 23 | Q | 39.4 | 0.0 | 0.0 | 60.6 | 100 | 78 | 293 | 1200 |
| Ex. 24 | Q | 53.1 | 0.0 | 7.8 | 39.1 | 100 | 86 | 270 | 850 |
| Ex. 25 | N | 36.7 | 24.4 | 0.0 | 38.9 | 100 | 97 | 140 | <10 |
| Ex. 26 | O | 37.5 | 24.1 | 0.0 | 38.4 | 100 | 98 | 152 | <10 |
| Ex. 27 | P | 36.3 | 24.5 | 0.0 | 39.1 | 100 | 93 | 211 | 280 |

TABLE 2-continued

| | | Composition (mass %) | | | | Evaluation results | | |
|---|---|---|---|---|---|---|---|---|
| | | | | | | Reflectance | Strength | Acid resistance |
| | Glass | Glass | ZrO$_2$ | TiO$_2$ | Al$_2$O$_3$ | Total | (%) | (MPa) | (mg/cm$^2$) |
| Ex. 28 | Q | 36.3 | 24.5 | 0.0 | 39.1 | 100 | 95 | 244 | 680 |
| Ex. 29 | A | 39.8 | 0.0 | 5.2 | 55.0 | 100 | 89 | 280 | 820 |

TABLE 3

| | SiO$_2$ | B$_2$O$_3$ | Al$_2$O$_3$ | MgO | CaO | SrO | BaO | Li$_2$O | Na$_2$O | K$_2$O | TiO$_2$ | ZrO$_2$ | TOTAL |
|---|---|---|---|---|---|---|---|---|---|---|---|---|---|
| F' | 34.0 | 12.0 | 27.1 | 0.0 | 24.2 | 0.0 | 0.0 | 1.6 | 1.2 | 34.0 | 0.0 | 0.0 | 100.0 |

The present invention is useful for a backlight of a mobile phone, a large-sized liquid crystal TV, etc.

The entire disclosure of Japanese Patent Application No. 2009-233562 filed on Oct. 7, 2009 including specification, claims and summary is incorporated herein by reference in its entirety.

What is claimed is:

1. A ceramic material composition comprising from 20 to 50 mass % of a borosilicate glass powder, from 25 to 55 mass % of an alumina filler powder and from 10 to 45 mass % of a filler powder (a high refractive index filler powder) having a refractive index higher than the alumina filler powder, wherein the borosilicate glass powder comprises, as calculated as oxides, from 30 to 70 mass % of SiO$_2$, from 5 to 28 mass % of B$_2$O$_3$, from 5 to 30 mass % of Al$_2$O$_3$, from 3 to 35 mass % of CaO, from 0 to 25 mass % of SrO, from 0 to 25 mass % of BaO, from 0 to 10 mass % of Na$_2$O, from 0 to 10 mass % of K$_2$O, from 0.5 to 10 mass % of Na$_2$O+K$_2$O and from 3 to 40 mass % of CaO+SrO+BaO, and satisfies the following conditions:

in the borosilicate glass powder, as represented by mass %, the value of "three times the B$_2$O$_3$ content"+"twice (the CaO content+the SrO content+the BaO content)"+"ten times (the Na$_2$O content+the K$_2$O content)", is within a range of from 105 to 165.

2. The ceramic material composition according to claim 1, wherein the borosilicate glass powder contains, as calculated as oxides, from higher than 55 to 70 mass % of SiO$_2$, from 5 to 15 mass % of B$_2$O$_3$, from 5 to 15 mass % of Al$_2$O$_3$, from 3 to 20 mass % of CaO, from 0 to 10 mass % of SrO, from 0 to 10 mass % of BaO, from 0 to 10 mass % of Na$_2$O, from 0 to 10 mass % of K$_2$O, from 3 to 20 mass % of CaO+SrO+BaO and from 4 to 10 mass % of Na$_2$O+K$_2$O, and the value of "three times the B$_2$O$_3$ content"+"twice (the CaO content+the SrO content+the BaO content)"+"ten times (the Na$_2$O content+the K$_2$O content)", as represented by mass %, is within a range of from 105 to 140.

3. The ceramic material composition according to claim 1, wherein the borosilicate glass powder contains, as calculated as oxides, from 30 to 55 mass % of SiO$_2$, from 10 to 28 mass % of B$_2$O$_3$, from 5 to 30 mass % of Al$_2$O$_3$, from 3 to 35 mass % of CaO, from 0 to 25 mass % of SrO, from 0 to 25 mass % of BaO, from 0 to 10 mass % of Na$_2$O, from 0 to 10 mass % of K$_2$O, from 0.5 to 10 mass % of Na$_2$O+K$_2$O and from 10 to 40 mass % of CaO+SrO+BaO, and the value of "three times the B$_2$O$_3$ content"+"twice (the CaO content+the SrO content+the BaO content)"+"ten times (the Na$_2$O content+K$_2$O content)", as represented by mass %, is within a range of from 105 to 165.

4. The ceramic material composition according to claim 1, wherein the borosilicate glass powder contains substantially no Fe$_2$O$_3$ or has its content of less than 0.05 mass %.

5. The ceramic material composition according to claim 1, wherein in a ceramic sintered body obtainable by firing, the degree of crystallinity of a glass phase is at most 60% by the volume ratio.

6. The ceramic material composition according to claim 1, wherein the high refractive index filler powder is a ceramic having a refractive index higher than 1.95.

7. The ceramic material composition according to claim 6, wherein the high refractive index filler powder is a powder of zirconia, stabilized zirconia or partially stabilized zirconia.

8. A package to be mounted on a light emitting diode element, comprising a ceramic substrate obtained by molding and firing the ceramic material composition as defined in claim 1, and a wiring conductor formed in relation to the ceramic substrate.

* * * * *